US012813158B2

(12) United States Patent
Hanna et al.

(10) Patent No.: US 12,813,158 B2
(45) Date of Patent: Nov. 24, 2026

(54) ORGANIC SEMICONDUCTOR THIN FILM, TRANSISTOR, METHOD FOR PRODUCING ORGANIC SEMICONDUCTOR THIN FILM, METHOD FOR PRODUCING TRANSISTOR, AND METHOD FOR PRODUCING ELECTRONIC DEVICE

(71) Applicants: TOKYO INSTITUTE OF TECHNOLOGY, Tokyo (JP); NIKON CORPORATION, Tokyo (JP)

(72) Inventors: Jun-ichi Hanna, Tokyo (JP); Hao Wu, Tokyo (JP); Hiroaki Iino, Tokyo (JP)

(73) Assignees: TOKYO INSTITUTE OF TECHNOLOGY, Tokyo (JP); NIKON CORPORATION, Tokyo (JP)

( * ) Notice: Subject to any disclaimer, the term of this patent is extended or adjusted under 35 U.S.C. 154(b) by 364 days.

(21) Appl. No.: 18/510,867

(22) Filed: Nov. 16, 2023

(65) Prior Publication Data

US 2024/0090243 A1 Mar. 14, 2024

Related U.S. Application Data

(63) Continuation of application No. PCT/JP2022/020853, filed on May 19, 2022.

(30) Foreign Application Priority Data

May 20, 2021 (JP) ................................ 2021-085293

(51) Int. Cl.

| | |
|---|---|
| *H10K 85/00* | (2023.01) |
| *H10K 10/40* | (2023.01) |
| *H10K 10/46* | (2023.01) |
| *H10K 71/12* | (2023.01) |
| *H10K 85/60* | (2023.01) |

(52) U.S. Cl.

CPC ........... *H10K 85/731* (2023.02); *H10K 10/40* (2023.02); *H10K 10/462* (2023.02); *H10K 71/12* (2023.02); *H10K 85/00* (2023.02); *H10K 85/6576* (2023.02)

(58) Field of Classification Search

CPC .................................................... H10K 85/731

See application file for complete search history.

(56) References Cited

U.S. PATENT DOCUMENTS

2004/0002176 A1* 1/2004 Xu .......................... G11C 11/22 257/40
2015/0060800 A1 3/2015 Qiu et al.

FOREIGN PATENT DOCUMENTS

JP 2004-335492 A 11/2004
JP 2006-332249 A 12/2006

OTHER PUBLICATIONS

Japanese Office Action dated Aug. 27, 2024 for Japanese Application No. 2023-522722.

(Continued)

*Primary Examiner* — William D Young

(74) *Attorney, Agent, or Firm* — STAAS & HALSEY LLP

(57) ABSTRACT

An organic semiconductor thin film including a liquid crystalline organic semiconductor, in which Qp and Qt to be measured using a predetermined measurement method satisfy a predetermined requirement (1) and a rocking scan pattern has a ratio Ipeak/Ibas, that is a ratio of Ipeak which is a peak intensity of a maximum peak with respect to Ibas which is a base line value, of less than 10:0.06≤Qp/Qt≤0.5 . . . (1).

2 Claims, 11 Drawing Sheets

Rocking curve of Ph-BTBT-10/BCB/SiO2/Si
Dip coating film 30mm/sec at 130C p-xylene

(56) References Cited

OTHER PUBLICATIONS

Akifumi Yamamura et al., "Wafer-scale, layer-controlled organic single crystals for high-speed circuit operation", Science Advances, Feb. 2, 2018; 4:eaao5758, pp. 1-7.
Kondo Koichiro et al., "Fast speed fabrication of patterned organic semiconductor films by blade-coating using liquid crystalline organic semiconductor and their transistor characteristics", The 68th JSAP spring Meeting, 2021, p. 11-353(19a-Z18-5).
Hao Wu et al., "Scalable Ultrahigh-Speed Fabrication of Uniform Polycrystalline Thin Films for Organic Transistors", ACS Applied Materials & Interfaces, May 21, 2020, vol. 12, pp. 29497-29504.
International Search Report dated Aug. 9, 2022 for International Application No. PCT/JP2022/020853.
Written Opinion of the International Searching Authority dated Aug. 9, 2022 for International Application No. PCT/JP2022/020853.

* cited by examiner

In plane XRD of Ph-BTBT-10/BCB/SiO2/Si
Dip coating film 1mm/sec
at 130C p-xylene Rocking curve of Ph-BTBT-10/BCB/SiO2/Si
Dip coating film 1mm/sec at 130C p-xylene In plane XRD of Ph-BTBT-10/BCB/SiO2/Si
Dip coating film 5mm/sec
at 130C p-xylene Rocking curve of Ph-BTBT-10/BCB/SiO2/Si
Dip coating film 5mm/sec at 130C p-xylene In plane XRD of Ph-BTBT-10/BCB/SiO2/Si
Dip coating film 10mm/sec
at 130C p-xylene Rocking curve of Ph-BTBT-10/BCB/SiO2/Si
Dip coating film 10mm/sec at 130C p-xylene Rocking curve of Ph-BTBT-10/BCB/SiO2/Si
Dip coating film 15mm/sec at 130C p-xylene In plane XRD of Ph-BTBT-10/BCB/SiO2/Si
Dip coating film 20mm/sec
at 130C p-xylene Rocking curve of Ph-BTBT-10/BCB/SiO2/Si
Dip coating film 20mm/sec at 130C p-xylene In plane XRD of Ph-BTBT-10/BCB/SiO2/Si
Dip coating film 30mm/sec
at 130C p-xylene Rocking curve of Ph-BTBT-10/BCB/SiO2/Si
Dip coating film 30mm/sec at 130C p-xylene In plane XRD of Ph-BTBT-10/BCB/SiO2/Si
Dip coating film 40mm/sec
at 130C p-xylene In plane XRD of Ph-BTBT-10/SiO2/Si
Spin coating film 3000rpm 30sec
at 80C p-xylene Rocking curve of Ph-BTBT-10/BCB/SiO2/Si
spin coating film 3000rpm at 80C p-xylene Peaks area ratio and variation of mobility in Ph-BTBT-10 dipping coating films

ORGANIC SEMICONDUCTOR THIN FILM, TRANSISTOR, METHOD FOR PRODUCING ORGANIC SEMICONDUCTOR THIN FILM, METHOD FOR PRODUCING TRANSISTOR, AND METHOD FOR PRODUCING ELECTRONIC DEVICE

CROSS-REFERENCE TO RELATED APPLICATIONS

The present application is a continuation application of International Application No. PCT/JP2022/020853, filed May 19, 2022, which claims priority to Japanese Patent Application No. 2021-085293, filed May 20, 2021, the contents of each of which are incorporated herein by reference.

TECHNICAL FIELD

The present invention relates to an organic semiconductor thin film, a transistor, a method for producing an organic semiconductor thin film, a method for producing a transistor, and a method for producing an electronic device.

BACKGROUND ART

Solvent evaporation methods have been investigated as methods for producing an organic semiconductor thin film. Solvent evaporation methods are methods for producing an organic semiconductor film by evaporating a solvent from an organic semiconductor solution and precipitating an organic semiconductor substance from the solution.

Film formation methods in which a solvent evaporation method is used include a dip coating method, a drop casting method, a spin coating method, an inkjet method, a gravure printing method, and the like. These processes in which a solution is used are industrially useful methods in that the processes do not require a vacuum and can be implemented simply and inexpensively and high-performance organic semiconductor thin films can be produced at low temperatures of 200° C. or lower.

When producing single crystal films or single crystal-like crystal films using solvent evaporation methods, organic semiconductor crystal films having high carrier mobilities of 1 to 10 $cm^2/Vs$ can be produced. However, for example, as described in NPL 1, a film formation rate is as slow as about 100 μm/second to 1 mm/second and there is room for improvement from the viewpoint of the film formation rate for industrial applications.

CITATION LIST

Non-Patent Document

[Non-Patent Document 1]

Yamamura et al., Sci. Adv. 2018; 4: eaao5758 2 Feb. 2018

SUMMARY OF INVENTION

In an organic semiconductor film of the present invention, Qp and Qt to be measured using the measurement method which will be described below satisfy the following (1) and the following rocking scan pattern has a ratio Ipeak/Ibas, that is a ratio of Ipeak which is a peak intensity of the following maximum peak with respect to Ibas which is the following base line value, of less than 10:

$$0.06 \leq Qp/Qt \leq 0.5. \quad (1)$$

[Measurement Method]

(i) A diffraction angle 2θ at which a peak of a (020) crystal plane is observed is specified by performing X-ray diffraction measurement on an organic semiconductor thin film in an in-plane direction of a surface of a substrate.

(ii) A rocking scan pattern is obtained by fixing positions of the diffraction angle 2θ and a detector and performing X-ray diffraction measurement on the substrate on which the organic semiconductor thin film is formed in the in-plane direction of the surface of the substrate while rotating only the substrate by 180°.

(iii) A base line of the rocking scan pattern is obtained.

(iv) A maximum peak beyond the base line in a positive direction is specified in the rocking scan pattern and an area of a peak portion which exceeds the base line is defined as Qp.

(v) A total peak area of the rocking scan pattern is defined as Qt.

DESCRIPTION OF EMBODIMENTS

<Organic Semiconductor Thin Film>

Figure 1A:
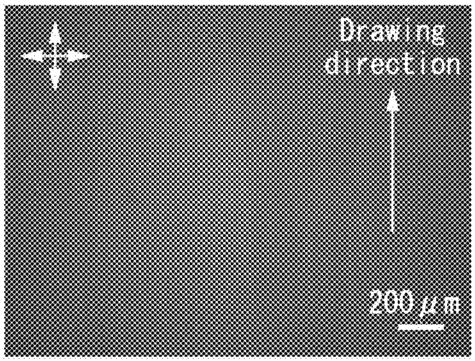
FIG. 1A is a polarizing microscope photograph of an organic semiconductor film of Comparative Example 1.

An embodiment includes an organic semiconductor thin film including a liquid crystalline organic semiconductor.

The organic semiconductor thin film in the embodiment is produced using a method for producing an organic semiconductor thin film in the embodiment which will be described later.

In the organic semiconductor thin film in the embodiment, Qp and Qt to be measured using the measurement method which will be described below satisfy (1). Furthermore, a ratio Ipeak/Ibas, that is a ratio of Ipeak which is a peak intensity of the following maximum peak with respect to Ibas which is the following base line value, is less than 10:

$$0.06 \leq Qp/Qt \leq 0.5. \quad (1)$$

[Measurement Method]

(i) A diffraction angle 2θ at which a peak of a (020) crystal plane is observed is specified by performing X-ray diffraction measurement on an organic semiconductor thin film in an in-plane direction of a surface of a substrate.

(ii) A rocking scan pattern is obtained by fixing positions of the diffraction angle 2θ and a detector and performing X-ray diffraction measurement on the substrate on which the organic semiconductor thin film is formed in the in-plane direction of the surface of the substrate while rotating only the substrate by 180°.

(iii) A base line of the rocking scan pattern is obtained.

(iv) A maximum peak which exceeds the base line in a positive direction is specified in the rocking scan pattern and an area of a peak portion which exceeds the base line is defined as Qp.

(v) A total peak area of the rocking scan pattern is defined as Qt.

In Step (i), the diffraction angle 2θ at which the peak of the (020) crystal plane is observed is specified because the peak of the (020) crystal plane is more likely to be observed. For example, even if a peak of a (110) plane or a (120) plane that is another crystal plane is observed, similarly a diffraction angle 2θχ can be specified.

In Step (ii), irradiation of X-rays is possible from all directions and the orientation of the direction of the crystal plane can be omni-directionally confirmed by fixing the position of the detector at 2θχ and performing X-ray diffraction measurement on the substrate on which the organic semiconductor thin film is formed in the in-plane direction of the surface of the substrate while rotating only the substrate by 180°.

In Step (iii), the rocking scan pattern obtained in Step (ii) is analyzed using analysis software. At the time of smoothing processing in the analysis software, for example, Global fit manufactured by Rigaku can be used.

Examples of the smoothing processing include convolution using a Gaussian function.

In Step (iii), a base line of the rocking scan pattern is obtained. Here, the "base line" is a value obtained by finding a minimum value after the smoothing processing using the analysis software and calculating an average value within a range in which sharp peaks are not included. The range in which the sharp peaks are not included is a range of 2.5 degrees before and after the minimum value.

In the embodiment, the ratio Ipeak/Ibas is less than 10 in the rocking scan pattern. This indicates, that is, that the (020) crystal plane is a random film observed in all directions in the above measurement method.

In Step (v), a peak which exceeds the base line in the positive direction is specified in the rocking scan pattern and the area of the peak portion which exceeds the base line is defined as Qp. A peak is observed in the rocking scan pattern of the organic semiconductor thin film in the embodiment. This is because that, since the base material is coated with the organic semiconductor solution in one direction at a rate which exceeds 10 mm/second in the step of producing the organic semiconductor film, the orientation of the crystals has anisotropy.

For example, when the base material is coated with the organic semiconductor solution through spin-coating, the orientation of the crystals does not have anisotropy. Thus, a peak is not observed in the rocking scan pattern of the organic semiconductor thin film.

Qp is an area formed by the base line and a portion which exceeds the base line.

In Step (v), Qt that is a total area of the rocking scan pattern is obtained.

If Qp and Qt satisfy (1), in the above measurement method, it can be seen that the (020) crystal plane is a random film observed in all directions and the orientation of the crystals has anisotropy.

(1) is preferably any one (1)-1 to (1)-3 which will be described below:

$$0.07 \leq Qp/Qt \leq 0.49 \quad (1)\text{-}1$$

$$0.08 \leq Qp/Qt \leq 0.48 \quad (1)\text{-}2$$

$$0.09 \leq Qp/Qt \leq 0.47. \quad (1)\text{-}3$$

A variation of mobilities in the organic semiconductor film whose Qp and Qt satisfy (1) is small. Here, the expression "variation of mobilities is small" means that a coefficient of variability obtained using the method described in [Evaluation of carrier mobility] which will be described below is 20% or less.

[Evaluation of Carrier Mobility]

(Measurement of Carrier Mobility $\mu^{AV}$)

For the organic thin film transistor, carrier mobilities of all produced carrier mobility measurement samples are measured.

Specifically, a voltage of −50 V is applied between a source electrode and a drain electrode of each organic thin film transistor element, a gate voltage is changed within a range of +10 V to −70 V, and a carrier mobility μ ($cm^2/Vs$) is calculated using the following Expression representing a drain current Id. An average value of the carrier mobilities of all of the samples is obtained and this value is defined as a carrier mobility $\mu^{AV}$.

When the carrier mobility $\mu^{AV}$ is higher, a more preferable result has been obtained.

$$I_d = (w/2L)\mu C_i(V_g - V_{th})^2$$

In the expression, L represents a channel length, w represents a channel width, μ represents a carrier mobility, $C_i$ represents a capacitance per unit area of a gate insulation layer, $V_g$ represents a gate voltage, and $V_{th}$ represents a threshold value voltage.

(Calculation of Coefficient of Variability)

With regard to the organic thin film transistor, for the carrier mobilities μ of all of the samples measured in the test described above (Measurement of carrier mobility $\mu^{AV}$) the coefficient of variability is calculated using the following Expression.

In the following Expression, the standard deviation is calculated using a standard method and the carrier mobility $\mu^{AV}$ is used as the average value. Evaluation is performed using this coefficient of variability as an index of a variation of the carrier mobilities.

Differential coefficient (%)=(standard deviation/average value)×100

In the embodiment, if Qp and Qt satisfy (1), it is possible to reduce a variation of mobilities even in the case of a polycrystalline film. A rational reason for this can be explained as follows.

If Qp and Qt satisfy (1), a proportion of crystal grains in which the crystal grains are oriented in a specific direction of the crystal film decreases and a proportion of crystal grains in which the crystal grains are randomly oriented in a plane increases. When forming an element in which such a crystal film is used, even if the mobility in the crystal grain has anisotropy, the characteristics thereof are averaged and the variation in element mobility can be suppressed to be small. This point is a different approach from the approach in which the single crystalline crystal film in the related art is used and provides a significant advantage industrially.

In an embodiment of the organic semiconductor thin film of the embodiment, an average mobility of 1 $cm^2/Vs$ or more can be provided.

In the case of the mobility, a mobility is calculated from the transistor characteristics in a saturation region using a commonly used FET mobility evaluation method, that is, using a $SiO_2/Si$ substrate for a gate insulation film/gate electrode to prepare a bottom gate bottom contact type transistor.

In an embodiment of the organic semiconductor thin film in the embodiment, an average film thickness is preferably 100 nm or less, more preferably 50 nm or less, and still more preferably 30 nm or less.

<Transistor>

The embodiment includes a transistor including the organic semiconductor thin film in the embodiment as a semiconductor layer.

In the organic semiconductor film including in the transistor in the embodiment, Qp and Qt satisfy the above (1). Furthermore, in the rocking scan pattern, the ratio Ipeak/Ibas, that is the ratio of Ipeak which is a peak intensity of the following maximum peak with respect to Ibas which is the following base line value, is less than 10.

In the related art, when the organic semiconductor film is prepared, the characteristics of the crystal film are homogenized by controlling the growth of the crystal grains of the organic semiconductor, aligning an orientation direction of the crystal grains, and increasing a size of a grain diameter to reduce the effects of the crystal grain boundaries. However, although the density of the grain boundaries in the entire crystal film can be reduced in this method, when used as a semiconductor layer of a transistor, the number of small crystal grain boundaries which can be exist in a channel region varies significantly between elements, and as a result, a large variation occurs in the element characteristics.

Thus, in order to reduce the variation between the elements of the transistor, conversely, it is conceivable to increase crystal grain boundaries in the organic semiconductor film. Here, in this case, since the density of the crystal grain boundaries existing in the channel region of the transistor also increases, the characteristics of carrier transport deteriorate and the performance as an element is impaired.

On the other hand, the organic semiconductor film in the embodiment can suppress the formation of the crystal grain boundaries which inhibit the carrier transport while increasing the number of crystal grain boundaries. Here, the crystal grain boundaries which inhibit carrier transport are formed due to crystal domains oriented in a specific direction. In addition, in the organic semiconductor film of the embodiment, the orientation in the specific direction of the crystal domains is suppressed.

In the organic semiconductor film in the embodiment, an average grain diameter of the crystal domains is preferably 1 μm or more and 300 μm or less, more preferably 1 μm or more and 200 μm or less, and still more preferably 1 μm or more and 100 μm or less.

Also, in the organic semiconductor film in the embodiment, an aspect ratio (ratio of a long diameter with respect to a short diameter (ling diameter/short diameter)) of the crystal domains is preferably 5 or less, more preferably 3 or less, and still more preferably 2 or less. Furthermore, when the organic semiconductor film includes crystal domains having an aspect ratio different from the aspect ratio described above, an area ratio of the crystal domains having the aspect ratio described above in the organic semiconductor film is preferably 30% or more, more preferably 50% or more, and still more preferably 70% or more.

<Method for Producing Organic Semiconductor Thin Film>

The embodiment relates to a method for producing an organic semiconductor thin film.

The method for producing an organic semiconductor thin film of the embodiment has a step of dissolving a liquid crystalline organic semiconductor in an organic solvent to prepare an organic semiconductor solution, a step of coating a base material with the organic semiconductor solution at a rate exceeding 10 mm/second, and a step of drying the organic semiconductor solution.

Each of the steps will be described below.

[Step of Preparing Organic Semiconductor Solution]

First, an organic semiconductor is dissolved in an organic solvent to prepare an organic semiconductor solution.

Examples of the organic semiconductor used in the embodiment include organic semiconductors having a structure in which one or two alkyl chains are substituted in a molecular long axis direction of π-electron-based skeleton responsible for charge transport.

Although it is preferable that then-electron-based skeleton of the organic semiconductor used in the embodiment be a thienoacene-based skeleton typified by a Benzothieneobenzothiazole skeleton, the present invention is not limited to this.

Representative examples of compounds having a thienoacene-based skeleton include the compounds described in PCT International Publication No. WO 2012-121393.

In the embodiment, among these, 2-decyl-7-phenylbenzotheneobenzothiophene (Ph-BTBT-10), derivatives thereof with different chain lengths, and derivatives in which a side chain is substituted on the phenyl group side are particularly preferred.

Organic semiconductor molecules having alkyl groups used in the embodiment exhibit liquid crystalline properties. If the organic semiconductor molecules exhibit liquid crystalline properties, it is possible to produce a uniform and flat crystal film. Furthermore, it is appropriate for forming an organic crystal film for a transistor from the viewpoint of facilitating the control of crystal grain boundaries (for example, refer to non-patent paper (Adv. Mater., 23, 1748-1751, 2006), NPL (Jpn. J. Appl. Phys., 45, L867-870, 2006), and the like).

In preparing a semiconductor solution, a small amount of an insulating polymer such as polystyrene may be added to control the morphology of the formed organic semiconductor film. When an insulating polymer is added, an amount thereof can be appropriately adjusted within a range of 0.1% by mass or more and 10% by mass or less with respect to the total amount of the organic semiconductor.

It is preferable that the organic solvent used in the embodiment be an organic solvent having a boiling point of 250° C. or lower, and more preferably 200° C. or lower for film formation near room temperature.

To be specific, examples of the organic solvent include alkyl-substituted benzene derivatives such as toluene, xylene, and diethylbenzene in which organic semiconductors can dissolve.

Also, the alkyl-substituted benzene derivative may be substituted with a halogen atom or an alkoxy or thioalkoxy group.

Examples of those substituted with an alkoxy group include anisole and thioanisole derivatives.

In the embodiment, among the above, it is preferable to use an organic solvent which dissolves the organic semiconductor at a concentration of 0.01% by mass or more and it is more preferable to use an organic solvent which dissolves the organic semiconductor at a concentration of 0.1% by mass or more.

[Coating Step]

Subsequently, a liquid film of the organic semiconductor solution is formed on the base material in accordance with a coating method.

In the embodiment, it is preferable that the base material be unidirectionally coated with the organic semiconductor solution. Examples of the method of applying an organic semiconductor solution include dip coating methods, but are not limited to these. In addition, other known methods may be used as long as they can be applied in one direction to the base material.

A thickness of the organic semiconductor film is generally selected in accordance with a type of device to be prepared such as an organic EL element, an optical sensor, a solar cell, a transistor, and the like. For example, when preparing an organic transistor, a film thickness thereof is set to 5 nm or more and 200 nm or less, more preferably 5 nm or more and 100 nm or less, and still more preferably 5 nm or more and 50 nm or less. The film thickness of the crystal film to be prepared can be directly controlled using the thickness of the liquid film applied to the base material. Furthermore, generally, it is known that the thickness of the crystal film to be formed can be appropriately controlled through a type of solvent to be used, a concentration of the organic semiconductor to be used, a type of base material to be used, a temperature of the organic semiconductor solution to be used, and a temperature of the base material to be applied.

In the embodiment, when using an organic semiconductor that exhibits liquid crystalline properties, it is effective to set a temperature at which a liquid film of the organic semiconductor solution is formed on the base material to the vicinity of a liquid crystal phase temperature of the liquid crystalline organic semiconductor to be used.

A temperature at the time of forming a liquid film may be controlled heating the base material. When using a dip coating method, control is possible using a temperature of the organic semiconductor solution at the time of immersing the base material.

For example, when Ph-BTBT-10 is used as an organic semiconductor exhibiting liquid crystalline properties, it is preferable to adjust a film formation temperature within the range of 40° C. or higher and 150° C. or lower. Furthermore, when using C8-BTBT, it is preferable to adjust the film formation temperature within the range of 30° C. or higher and 120° C. or lower.

In the embodiment, a rate of coating the base material with the organic semiconductor solution exceeds 10 mm/second, preferably 15 mm/second or more, and more preferably 30 mm/second or more.

Although an upper limit of the rate of coating the base material with the organic semiconductor solution is not particularly limited, the rate of coating the base material with the organic semiconductor solution is, for example, 5000 mm/second or less, 1000 mm/second or less, 500 mm/second or less, or 100 mm/second or less.

Upper and lower limits of the lifting rate can be combined arbitrarily.

Examples of the combination are over 10 mm/second and 120 mm/second or less, over 10 mm/second and 100 mm/second or less, 20 mm/second or more and 80 mm/second or less, and 40 mm/second or more and 60 mm/second or less.

[Step of Drying Organic Semiconductor Solution]

In the production method of the embodiment, the base material is coated with the organic semiconductor solution and a liquid layer of the organic semiconductor solution is formed on the base material. Furthermore, the organic solvent contained in the liquid layer evaporates and dries, crystals precipitate, and a solid film of the organic semiconductor is formed on a surface of the base material. That is to say, in the embodiment, a rate at which the base material is lifted from the organic semiconductor solution is synonymous with a film formation rate and may be hereinafter referred to as a "film formation rate" in some cases.

In the embodiment, an organic semiconductor thin film can be formed at a film formation rate exceeding 10 mm/second which is significantly faster than the film formation rate in the related art.

In the embodiment, in the case of a dip coating method, generally, although the base material is lifted vertically from a liquid surface of the organic semiconductor solution, lifting the base material at an angle is also effective in controlling a thickness of the liquid film.

The base material is not particularly limited and glass, quartz glass, silicon wafers, metal plates, and flexible resin sheets can be used as the base material.

For example, a plastic film can be used as a sheet. Examples of the plastic film include films made of polyethylene terephthalate (PET), polyethylene naphthalate (PEN), polyethersulfone (PES), polyetherimide, polyetheretherketone, polyphenylene sulfide, polyarylate, polyimide, polycarbonate (PC), cellulose triacetate (TAC), cellulose acetate propionate (CAP), and the like.

As described above, since the production method of the embodiment can form a film using coating with a semiconductor solution at a low temperature of 200° C. or less, the production method of the embodiment is less subjected to restrictions on a material, a size, and a shape of the base material. For this reason, the production method of the embodiment can also be applied to a continuous type mass production device for a so-called roll-to-roll process and the like.

<Method for Producing Transistor>

An embodiment includes a method for producing a transistor having a semiconductor layer.

The method for producing a transistor of the embodiment includes a step of forming a semiconductor layer using the method of producing an organic semiconductor film of the embodiment.

<Method for Producing Electronic Device>

An embodiment includes a method for producing an electronic device.

A method for producing an electronic device of the embodiment includes a step of forming a transistor using the method for producing a transistor of the embodiment.

EXAMPLES

Although the present invention will be explained in more details below using examples, the present invention is not limited to the following examples.

<Preparation of Semiconductor Solution>

Ph-BTBT-10 was synthesized in accordance with NPL (Nature Commun., DOI: 0.1038/ncomms7828). After that, purification using silica column chromatography and recrystallization was repeatedly performed to improve the purity before use.

<Preparation of Substrate>

In forming an organic semiconductor film, A substrate in which a BCB film having a film thickness of about 20 nm was formed on a $p^+$-Si substrate having a thermally oxidized film of 300 nm formed thereon was used.

BCB is Dibutyltetramethyldisiloxane-bis {benzocyclobutene).

<Coating with Semiconductor Solution Using Dip Coating Method>

A crystal film was produced using a dip coater. The dip coater to be used includes a substrate setting part, a substrate raising part in which a lifting rate can be electrically controlled, and a container filled with an organic semiconductor solution which has been controlled so that a temperature thereof is kept constant. In this example, a dip coater in which a lifting rate of a substrate was up to 40 mm/second was used.

<Preparation and Evaluation of Transistor>

In preparing a transistor, a substrate obtained by vacuum-depositing Au on a $SiO_2$ (300 nm)/Si substrate coated with BCB having a film thickness of about 20 nm using a shadow mask through a vacuum deposition method, forming source and drain electrodes, and subjecting it to pentafluorobenzenethiol (PFBT) treatment inside a glove box was used as a substrate. A channel length and a channel width were 100 μm and 500 μm, respectively.

The characteristics of the prepared transistor were examined at room temperature in the atmosphere and the mobility was calculated from the characteristics of the transistor in the saturation region.

<Evaluation of Carrier Mobility>

The carrier mobility of the transistor was evaluated using the method described in [Evaluation of carrier mobility] described above.

Comparative Example 1

A $SiO_2$/Si substrate coated with BCB was immersed in a 0.5% by mass Ph-BTBT-10p-xylene solution maintained at 130° C. and the substrate was lifted at a rate of 1 mm/second in a direction opposite to that of a force of gravity at room temperature in the atmosphere. It was confirmed visually that a liquid film was formed on the substrate immediately after lifting, and the formation of a solid film was confirmed as the solvent dried.

The crystal film formed on the substrate was subjected to heat-treatment at 120° C. for 15 minutes.

FIG. 1A is a polarizing microscope photograph of a crystal film produced at a lifting rate of 1 mm/second. The crystal film of FIG. 1A exhibits a texture in which the crystal domains were oriented in a direction of film formation.

Figure 1B:
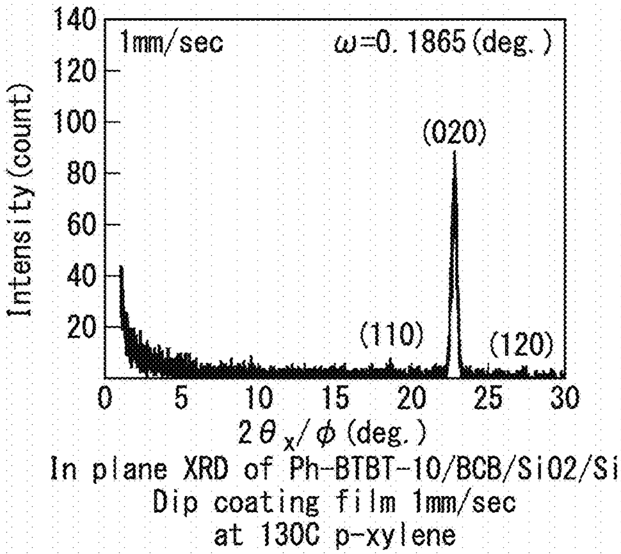
FIG. 1B is an X-ray diffraction pattern of the organic semiconductor film of Comparative Example 1.

A small angle incidence X-ray diffraction measurement was performed in an in-plane direction of a surface of the substrate of the crystal film and a diffraction angle $2\theta\chi$ at which the peak of a (020) crystal plane was observed was specified. The X-ray diffraction pattern obtained at this time is shown in FIG. 1B.

Figure 1C:
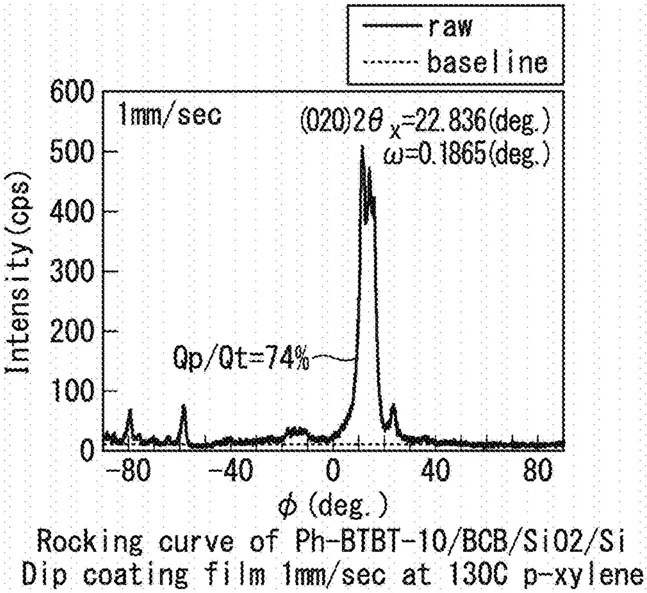
FIG. 1C is a rocking scan pattern of the organic semiconductor film of Comparative Example 1.

A rocking scan pattern was obtained by fixing a position of the detector at the diffraction angle $2\theta\chi$, and performing a small angle incidence X-ray diffraction measurement in the in-plane direction of the substrate on which the crystal film was formed while rotating only the substrate by 180°. The obtained rocking scan pattern is shown in FIG. 1C.

A base line was obtained by subjecting a rocking scan pattern to a smoothing processing (convolution using a Gaussian function) using analysis software (manufactured by Rigaku; Global fit) and then finding a minimum value and calculating an average value within the range in which sharp peaks are not included (2.5 degrees before and after the minimum value). In the rocking scan pattern, a peak exceeding the base line in a positive direction was specified and the area exceeding the base line was defined as Qp. Furthermore, the total area of the rocking scan pattern is defined as Qt.

The crystal film of Comparative Example 1 had a Qp/Qt of 0.74. Furthermore, from FIG. 1C, a ratio Ipeak/Ibas was 53.36 in the rocking scan pattern.

Figure 1D:
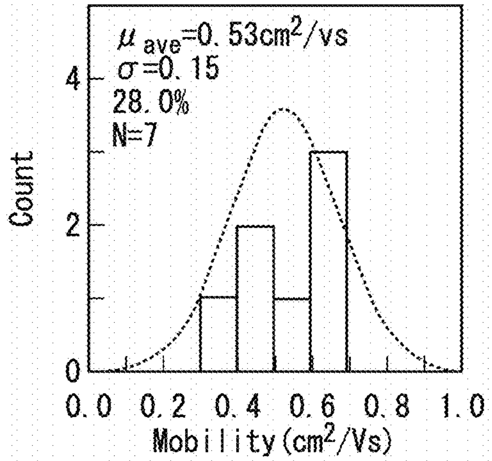
FIG. 1D is a diagram representing a distribution of mobilities of a transistor of the organic semiconductor film of Comparative Example 1.

FIG. 1D is a diagram representing a distribution of mobilities of a transistor formed at a film formation rate of 1 mm/second.

An average mobility of the transistor was 0.53 $cm^2/Vs$. Furthermore, a variation of the mobilities was 28.0%.

Comparative Example 2

A $SiO_2/Si$ substrate coated with BCB was immersed in a 0.5% by mass Ph-BTBT-10p-xylene solution maintained at 130° C. and the substrate was lifted at a rate of 5 mm/second in a direction opposite to that of a force of gravity at room temperature in the atmosphere. It was confirmed visually that a liquid film was formed on the substrate immediately after lifting, and the formation of a solid film was confirmed as the solvent dried.

The crystal film formed on the substrate was subjected to heat-treatment at 120° C. for 15 minutes.

Figure 2A:
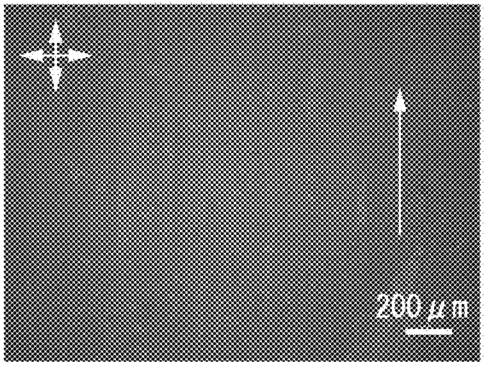
FIG. 2A is a polarizing microscope photograph of an organic semiconductor film of Comparative Example 2.

FIG. 2A is a polarizing microscope photograph of a crystal film produced at a lifting rate of 5 mm/second. The crystal film of FIG. 2A exhibits a texture in which the crystal domains were oriented in a direction of film formation.

Figure 2B:
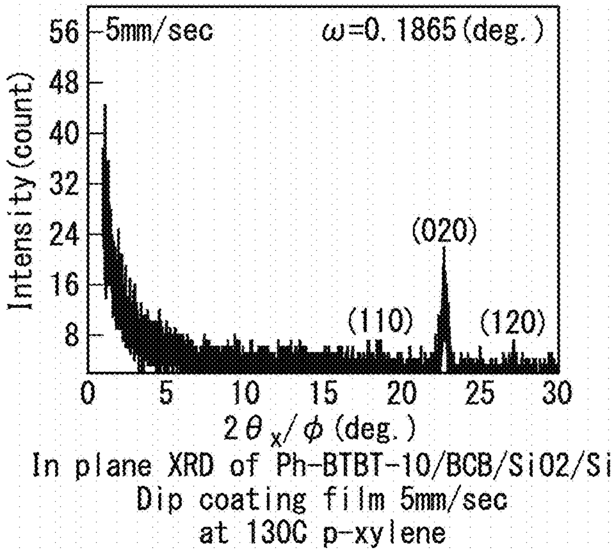
FIG. 2B is an X-ray diffraction pattern of the organic semiconductor film of Comparative Example 2.

An X-ray diffraction measurement was performed in an in-plane direction of a surface of the substrate of the crystal film and a diffraction angle 2θ at which the peak of a (020) crystal plane was observed was specified. The X-ray diffraction pattern obtained at this time is shown in FIG. 2B.

Figure 2C:
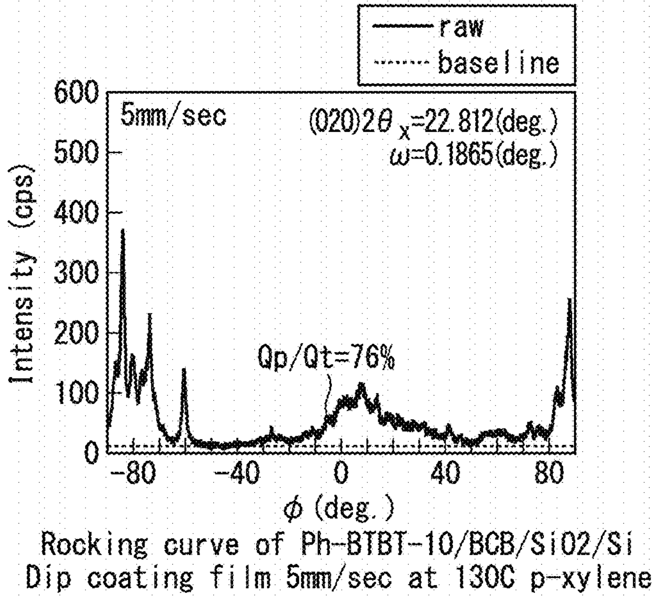
FIG. 2C is a rocking scan pattern of the organic semiconductor film of Comparative Example 2.

A rocking scan pattern was obtained by fixing the diffraction angle 2θ and a position of the detector and performing an X-ray diffraction measurement in an in-plane direction of a surface of the substrate on which the crystal film is formed while rotating only the substrate by 180°. The obtained rocking scan pattern is shown in FIG. 2C.

A base line was obtained by analyzing the rocking scan pattern using analysis software (manufactured by Rigaku; Global fit). In the rocking scan pattern, a maximum peak exceeding the base line in a positive direction was specified and an area of a peak exceeding the base line was defined as Qp. Furthermore, a total peak area of the rocking scan pattern was defined as Qt.

The crystal film of Comparative Example 2 had a Qp/Qt of 0.76. Furthermore, from FIG. 2C, a ratio Ipeak/Ibas was 29.40 in the rocking scan pattern.

Figure 2D:
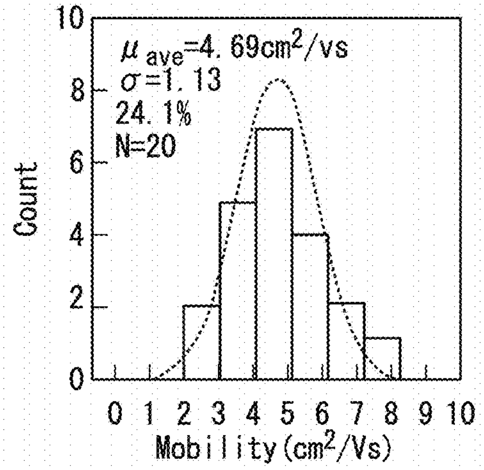
FIG. 2D is a diagram representing a distribution of mobilities of a transistor formed at a film formation rate of 5 mm/second.

FIG. 2D is a diagram representing a distribution of mobilities of a transistor formed at a film formation rate of 5 mm/second.

An average mobility of the transistor was 4.59 $cm^2/Vs$. A variation of the mobilities was 24.1%.

Comparative Example 3

A $SiO_2/Si$ substrate coated with BCB was immersed in a 0.5% by mass Ph-BTBT-10p-xylene solution maintained at 130° C. and the substrate was lifted at a rate of 10 mm/second in a direction opposite to that of a force of gravity at room temperature in the atmosphere. It was confirmed visually that a liquid film was formed on the substrate immediately after lifting, and the formation of a solid film was confirmed as the solvent dried.

The crystal film formed on the substrate was subjected to heat-treatment at 120° C. for 15 minutes.

Figure 3A:
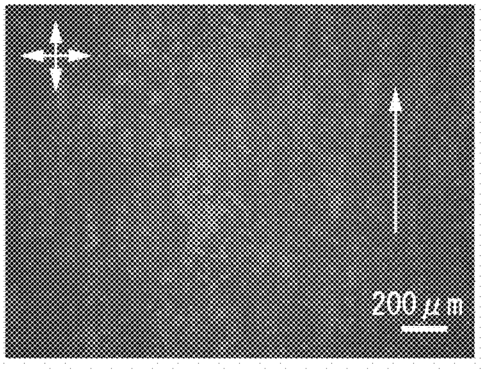
FIG. 3A is a polarizing microscope photograph of an organic semiconductor film of Comparative Example 3.

FIG. 3A is a polarizing microscope photograph of a crystal film produced at a lifting rate of 10 mm/second. The crystal film of FIG. 3A exhibits a texture in which the crystal domains were randomly oriented.

Figure 3B:
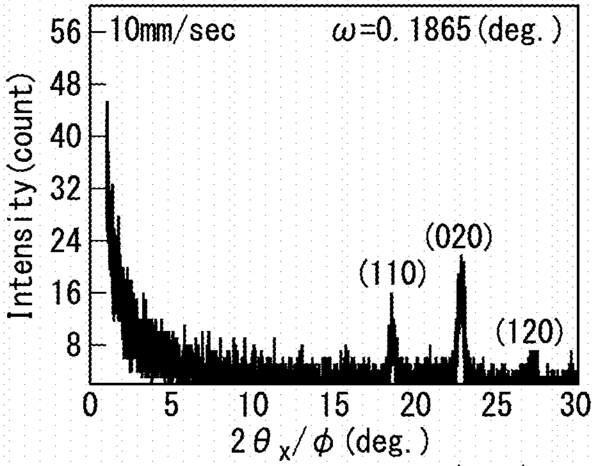
FIG. 3B is an X-ray diffraction pattern of the organic semiconductor film of Comparative Example 3.

An X-ray diffraction measurement was performed in an in-plane direction of a surface of the substrate of the crystal film and a diffraction angle 2θ at which the peak of a (020) crystal plane was observed was specified. The X-ray diffraction pattern obtained at this time is shown in FIG. 3B.

Figure 3C:
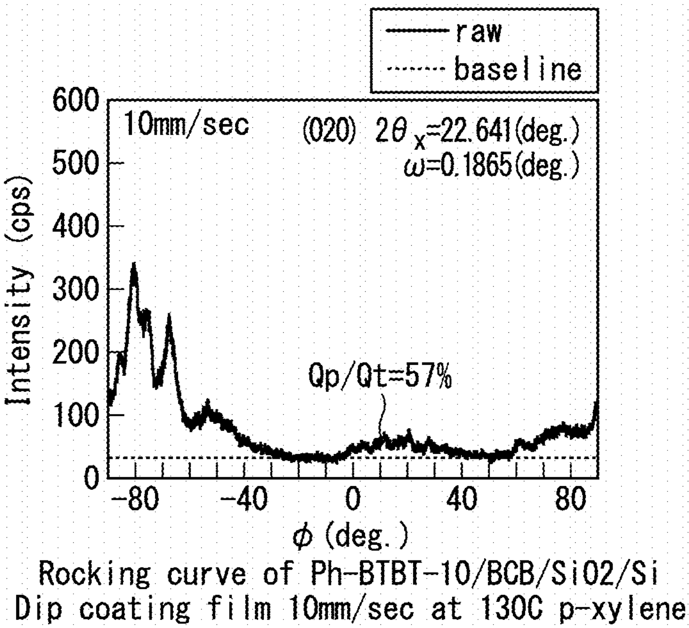
FIG. 3C is a rocking scan pattern of the organic semiconductor film of Comparative Example 3.

A rocking scan pattern was obtained by fixing the diffraction angle 2θ and a position of the detector and performing an X-ray diffraction measurement in an in-plane direction of a surface of the substrate on which the crystal film is formed while rotating only the substrate by 180°. The obtained rocking scan pattern is shown in FIG. 3C.

A base line was obtained by analyzing the rocking scan pattern using analysis software (manufactured by Rigaku; Global fit). In the rocking scan pattern, a maximum peak exceeding the base line in a positive direction was specified and an area of a peak exceeding the base line was defined as Qp. Furthermore, a total peak area of the rocking scan pattern was defined as Qt.

The crystal film of Comparative Example 3 had a Qp/Qt of 0.57. Furthermore, from FIG. 3C, a ratio Ipeak/Ibas was 10.09 in the rocking scan pattern.

Figure 3D:
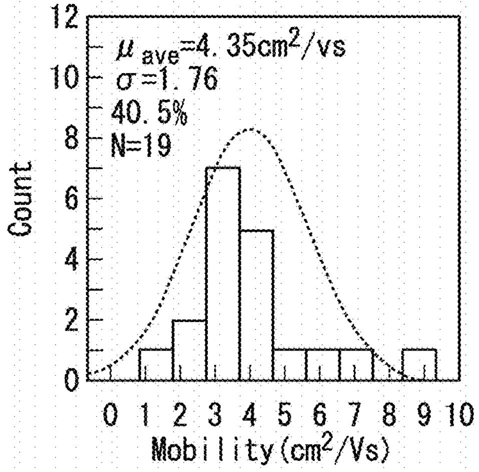
FIG. 3D is a diagram representing a distribution of mobilities of a transistor formed at a film formation rate of 10 mm/second.

FIG. 3D is a diagram representing a distribution of mobilities of a transistor formed at a film formation rate of 10 mm/second.

An average mobility of the transistor was 4.53 $cm^2/Vs$. Furthermore, a variation of the mobilities was 40.5%.

Example 1

A $SiO_2/Si$ substrate coated with BCB was immersed in a 0.5% by mass Ph-BTBT-10p-xylene solution maintained at 130° C. and the substrate was lifted at a rate of 15 mm/second in a direction opposite to that of a force of gravity at room temperature in the atmosphere. It was confirmed visually that a liquid film was formed on the substrate immediately after lifting, and the formation of a solid film was confirmed as the solvent dried.

The crystal film formed on the substrate was subjected to heat-treatment at 120° C. for 15 minutes.

Figure 4A:
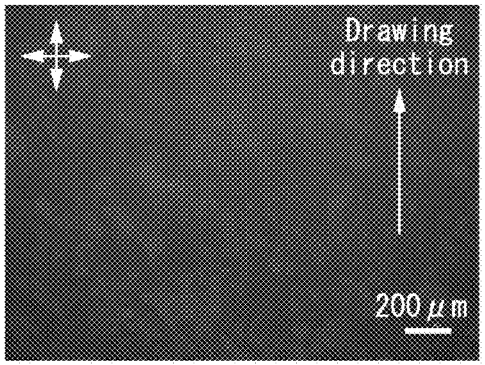
FIG. 4A is a polarizing microscope photograph of an organic semiconductor film of Example 1.

FIG. 4A is a polarizing microscope photograph of a crystal film produced at a lifting rate of 15 mm/second. The crystal film of FIG. 4A exhibits a texture in which the crystal domains are randomly oriented.

Figure 4B:
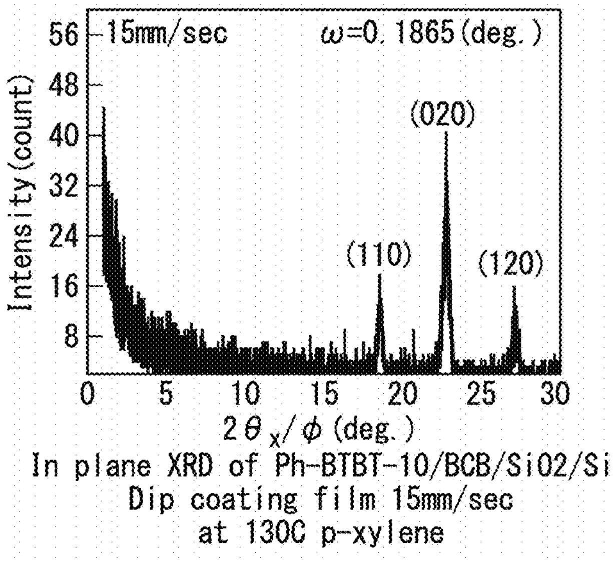
FIG. 4B is an X-ray diffraction pattern of the organic semiconductor film of Example 1.

An X-ray diffraction measurement was performed in an in-plane direction of a surface of the substrate of the crystal film and a diffraction angle 2θ at which the peak of a (020) crystal plane was observed was specified. The X-ray diffraction pattern obtained at this time is shown in FIG. 4B.

Figure 4C:
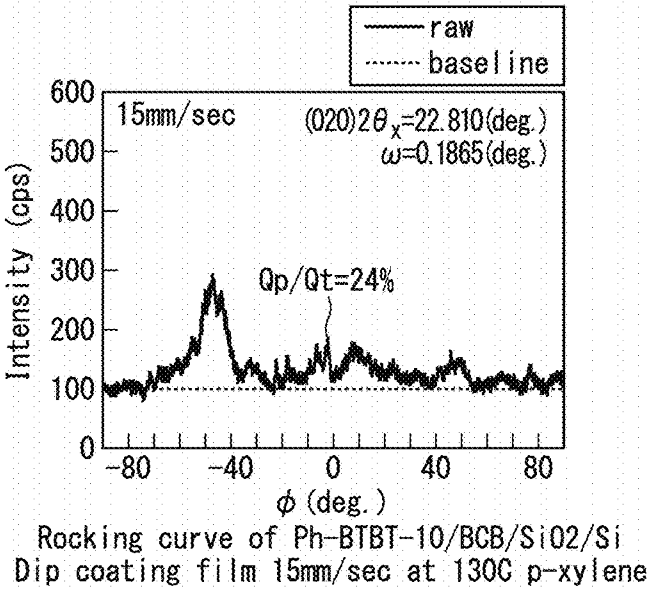
FIG. 4C is a rocking scan pattern of the organic semiconductor film of Example 1.

A rocking scan pattern was obtained by fixing the diffraction angle 2θ and a position of the detector and performing an X-ray diffraction measurement in an in-plane direction of a surface of the substrate on which the crystal film is formed while rotating only the substrate by 180°. The obtained rocking scan pattern is shown in FIG. 4C.

A base line was obtained by analyzing the rocking scan pattern using analysis software (manufactured by Rigaku; Global fit). In the rocking scan pattern, a maximum peak exceeding the base line in a positive direction was specified and an area of a peak exceeding the base line was defined as Qp. Furthermore, a total peak area of the rocking scan pattern was defined as Qt.

The crystal film of Example 1 had a Qp/Qt of 0.24. Furthermore, from FIG. 4C, a ratio Ipeak/Ibas was 2.94 in the rocking scan pattern.

A variation of mobilities of the transistor was 14.0%.

Example 2

A $SiO_2$/Si substrate coated with BCB was immersed in a 0.5% by mass Ph-BTBT-10p-xylene solution maintained at 130° C. and the substrate was lifted at a rate of 20 mm/second in a direction opposite to that of a force of gravity at room temperature in the atmosphere. It was confirmed visually that a liquid film was formed on the substrate immediately after lifting, and the formation of a solid film was confirmed as the solvent dried.

The crystal film formed on the substrate was subjected to heat-treatment at 120° C. for 15 minutes.

Figure 5A:
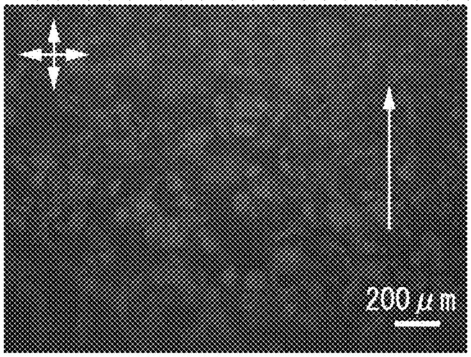
FIG. 5A is a polarizing microscope photograph of an organic semiconductor film of Example 2.

FIG. 5A is a polarizing microscope photograph of a crystal film produced at a lifting rate of 20 mm/second. The crystal film of FIG. 5A exhibits a texture in which the crystal domains are randomly oriented.

Figure 5B:
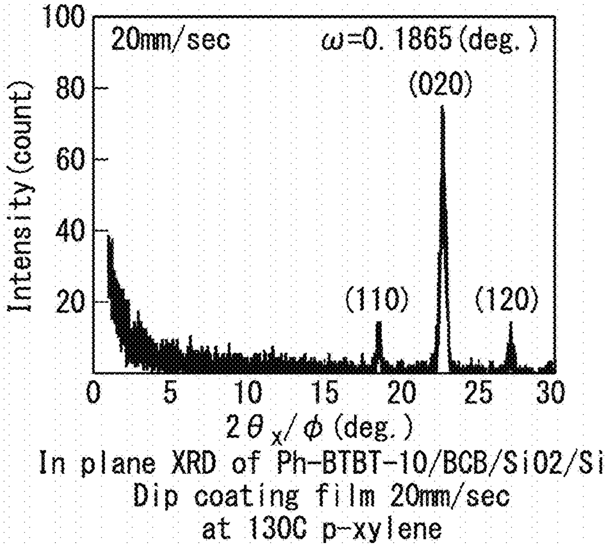
FIG. 5B is an X-ray diffraction pattern of the organic semiconductor film of Example 2.

An X-ray diffraction measurement was performed in an in-plane direction of a surface of the substrate of the crystal film and a diffraction angle 2θ at which the peak of a (020) crystal plane was observed was specified. The X-ray diffraction pattern obtained at this time is shown in FIG. 5B.

Figure 5C:
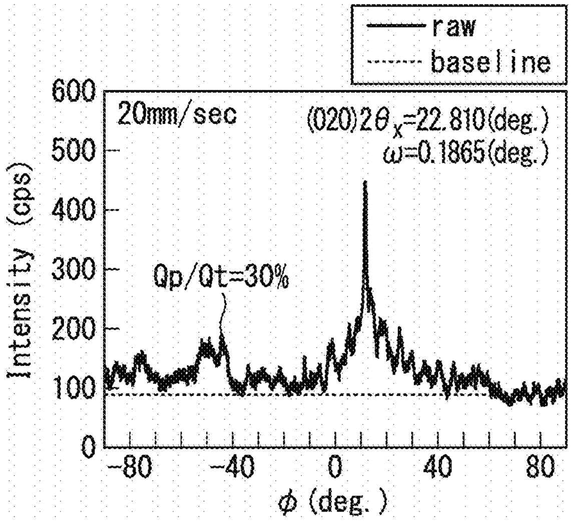
FIG. 5C is a rocking scan pattern of the organic semiconductor film of Example 2.

A rocking scan pattern was obtained by fixing the diffraction angle 2θ and a position of the detector and performing an X-ray diffraction measurement in an in-plane direction of a surface of the substrate on which the crystal film is formed while rotating only the substrate by 180°. The obtained rocking scan pattern is shown in FIG. 5C.

A base line was obtained by analyzing the rocking scan pattern using analysis software (manufactured by Rigaku; Global fit). In the rocking scan pattern, a maximum peak exceeding the base line in a positive direction was specified and an area of a peak exceeding the base line was defined as Qp. Furthermore, a total peak area of the rocking scan pattern was defined as Qt.

The crystal film of Example 2 had a Qp/Qt of 0.30. Furthermore, from FIG. 5C, a ratio Ipeak/Ibas was 4.959 in the rocking scan pattern.

A variation of mobilities of the transistor was 11.7%.

Example 3

A $SiO_2$/Si substrate coated with BCB was immersed in a 0.5% by mass Ph-BTBT-10p-xylene solution maintained at 130° C. and the substrate was lifted at a rate of 30 mm/second in a direction opposite to that of a force of gravity at room temperature in the atmosphere. It was confirmed visually that a liquid film was formed on the substrate immediately after lifting, and the formation of a solid film was confirmed as the solvent dried.

The crystal film formed on the substrate was subjected to heat-treatment at 120° C. for 15 minutes.

Figure 6A:
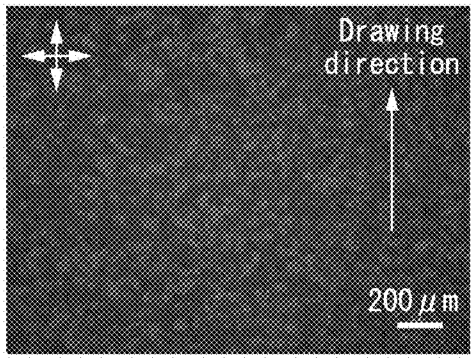
FIG. 6A is a polarizing microscope photograph of an organic semiconductor film of Example 3.

FIG. 6A is a polarizing microscope photograph of a crystal film produced at a lifting rate of 30 mm/second. The crystal film of FIG. 6A exhibits a texture in which the crystal domains are randomly oriented.

Figure 6B:
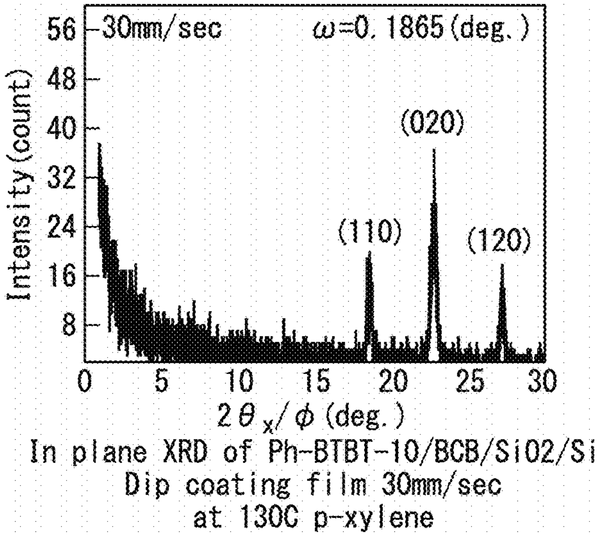
FIG. 6B is an X-ray diffraction pattern of the organic semiconductor film of Example 3.

An X-ray diffraction measurement was performed in an in-plane direction of a surface of the substrate of the crystal film and a diffraction angle 2θ at which the peak of a (020) crystal plane was observed was specified. The X-ray diffraction pattern obtained at this time is shown in FIG. 6B.

Figure 6C:
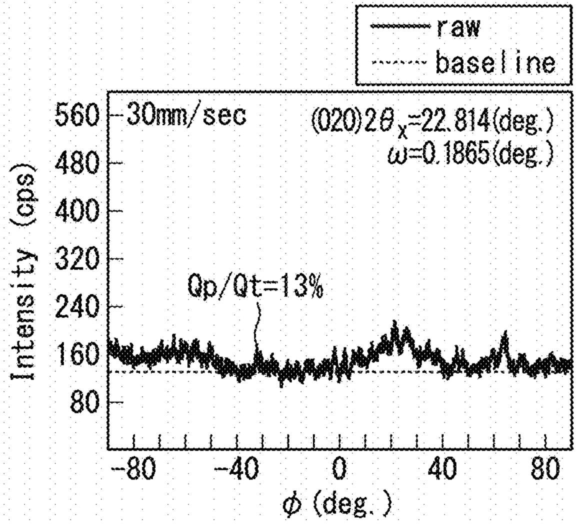
FIG. 6C is a rocking scan pattern of the organic semiconductor film of Example 3.

A rocking scan pattern was obtained by fixing the diffraction angle 2θ and a position of the detector and performing an X-ray diffraction measurement in an in-plane direction of a surface of the substrate on which the crystal film is formed while rotating only the substrate by 180°. The obtained rocking scan pattern is shown in FIG. 6C.

A base line was obtained by analyzing the rocking scan pattern using analysis software (manufactured by Rigaku; Global fit). In the rocking scan pattern, a maximum peak exceeding the base line in a positive direction was specified and an area of a peak exceeding the base line was defined as Qp. Furthermore, a total peak area of the rocking scan pattern was defined as Qt.

The crystal film of Example 3 had a Qp/Qt of 0.13. Furthermore, from FIG. 6C, a ratio Ipeak/Ibas was 1.645 in the rocking scan pattern.

A variation of mobilities of the transistor was 13.5%.

Example 4

A $SiO_2$/Si substrate coated with BCB was immersed in a 0.5% by mass Ph-BTBT-10p-xylene solution maintained at 130° C. and the substrate was lifted at a rate of 40 mm/second in a direction opposite to that of a force of gravity at room temperature in the atmosphere. It was confirmed visually that a liquid film was formed on the substrate immediately after lifting, and the formation of a solid film was confirmed as the solvent dried.

The crystal film formed on the substrate was subjected to heat-treatment at 120° C. for 15 minutes.

Figure 7A:
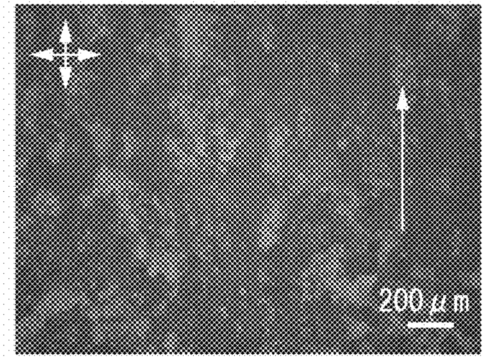
FIG. 7A is a polarizing microscope photograph of an organic semiconductor film of Example 4.

FIG. 7A is a polarizing microscope photograph of a crystal film produced at a lifting rate of 40 mm/second. The crystal film in FIG. 7A exhibits a texture in which the crystal domains are randomly oriented.

Figure 7B:
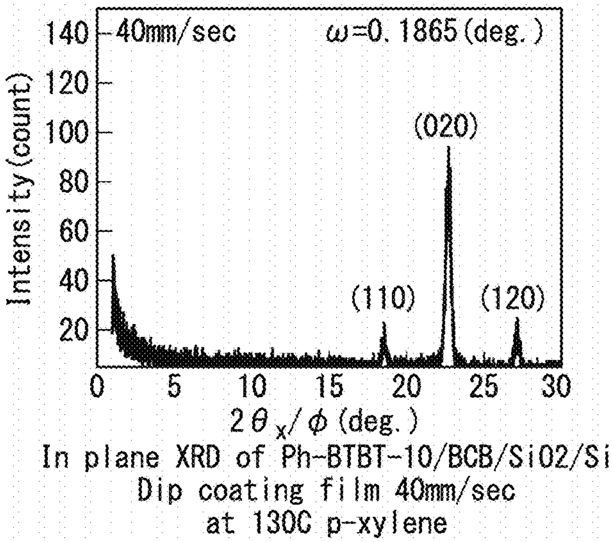
FIG. 7B is an X-ray diffraction pattern of the organic semiconductor film of Example 4.

An X-ray diffraction measurement was performed in an in-plane direction of a surface of the substrate of the crystal film and a diffraction angle 2θ at which the peak of a (020) crystal plane was observed was specified. The X-ray diffraction pattern obtained at this time is shown in FIG. 7B.

Figure 7C:
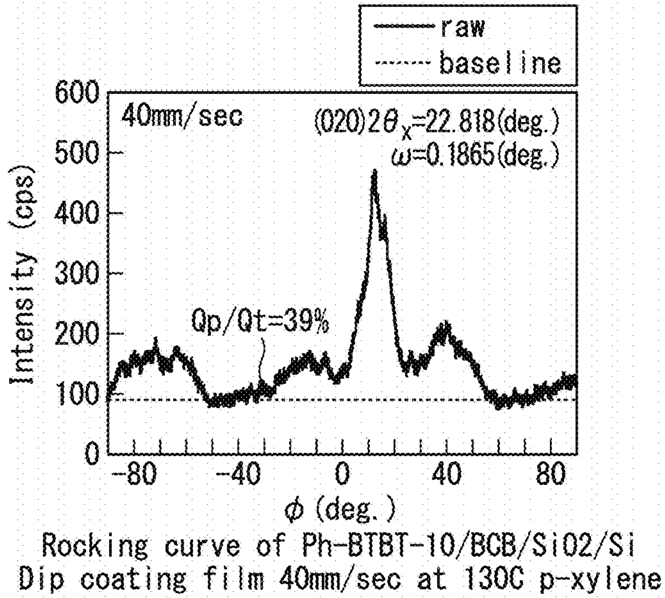
FIG. 7C is a rocking scan pattern of the organic semiconductor film of Example 4.

A rocking scan pattern was obtained by fixing the diffraction angle 2θ and a position of the detector and performing an X-ray diffraction measurement in an in-plane direction of a surface of the substrate on which the crystal film is formed while rotating only the substrate by 180°. The obtained rocking scan pattern is shown in FIG. 7C.

A base line was obtained by analyzing the rocking scan pattern using analysis software (manufactured by Rigaku; Global fit). In the rocking scan pattern, a maximum peak exceeding the base line in a positive direction was specified and an area of a peak exceeding the base line was defined as Qp. Furthermore, a total peak area of the rocking scan pattern was defined as Qt.

The crystal film of Example 4 had a Qp/Qt of 0.39. Furthermore, from FIG. 7C, a ratio Ipeak/Ibas was 5.199 in the rocking scan pattern.

Figure 7D:
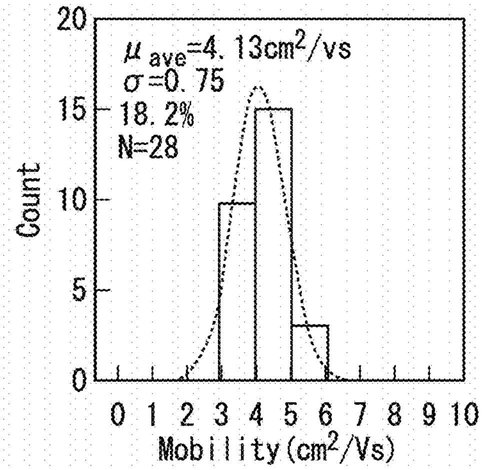
FIG. 7D is a diagram representing a distribution of mobilities of a transistor formed at a film formation rate of 40 mm/second.

FIG. 7D is a diagram representing a distribution of mobilities of a transistor formed at a film formation rate of 40 mm/second.

An average mobility of the transistor was 4.13 $cm^2$/Vs. A variation of the mobilities was 18.2%.

Comparative Example 4

A 0.5% by mass Ph-BTBT-10 p-xylene solution kept at 80° C. was spin-coated at 3000 rpm onto the $SiO_2$/Si substrate coated with BCB. Formation of a solid film was confirmed instantaneously with the spin coating.

The crystal film formed on the substrate was subjected to heat-treatment at 120° C. for 15 minutes.

Figure 8A:
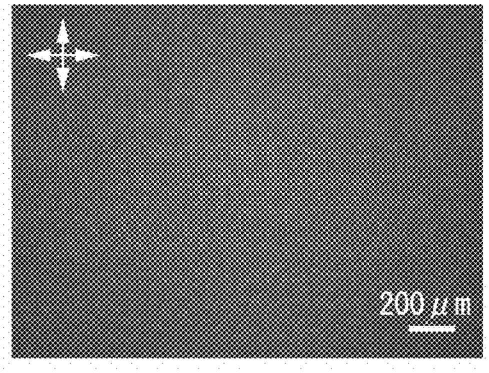
FIG. 8A is a polarizing microscope photograph of an organic semiconductor film of Comparative Example 4.

FIG. 8A is a polarizing microscope photograph of a crystal film produced using spin coating. The crystal film of FIG. 8A exhibits a texture in which the crystal domains are oriented in a direction of film formation.

Figure 8B:
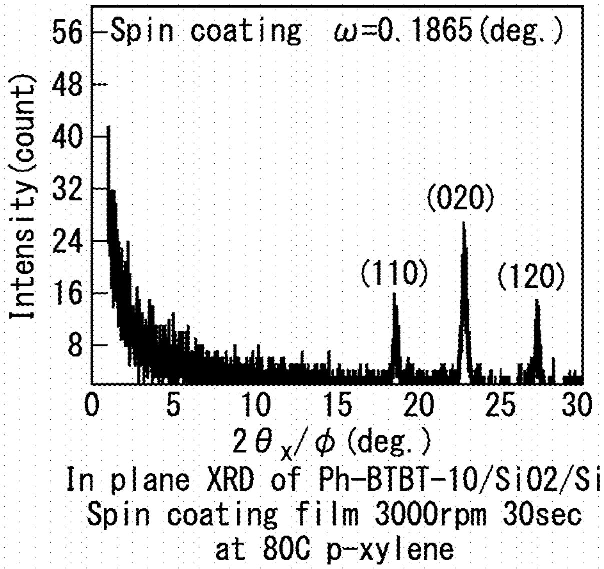
FIG. 8B is an X-ray diffraction pattern of the organic semiconductor film of Comparative Example 4.

An X-ray diffraction measurement was performed in an in-plane direction of a surface of the substrate of the crystal film and a diffraction angle 2θ at which the peak of a (020) crystal plane was observed was specified. The X-ray diffraction pattern obtained at this time is shown in FIG. 8B.

Figure 8C:
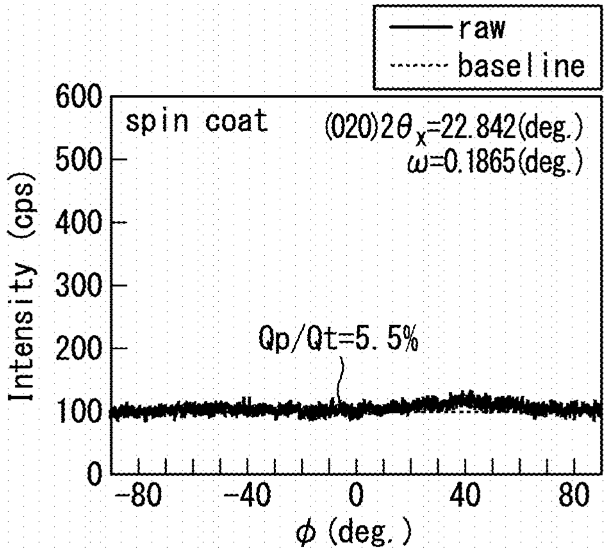
FIG. 8C is a rocking scan pattern of the organic semiconductor film of Comparative Example 4.

A rocking scan pattern was obtained by fixing the diffraction angle 2θ and a position of the detector and performing an X-ray diffraction measurement in an in-plane direction of a surface of the substrate on which the crystal film is formed while rotating only the substrate by 180°. The obtained rocking scan pattern is shown in FIG. 8C.

A maximum peak was not observed in the rocking scan pattern and Qp could not be calculated.

Figure 9:
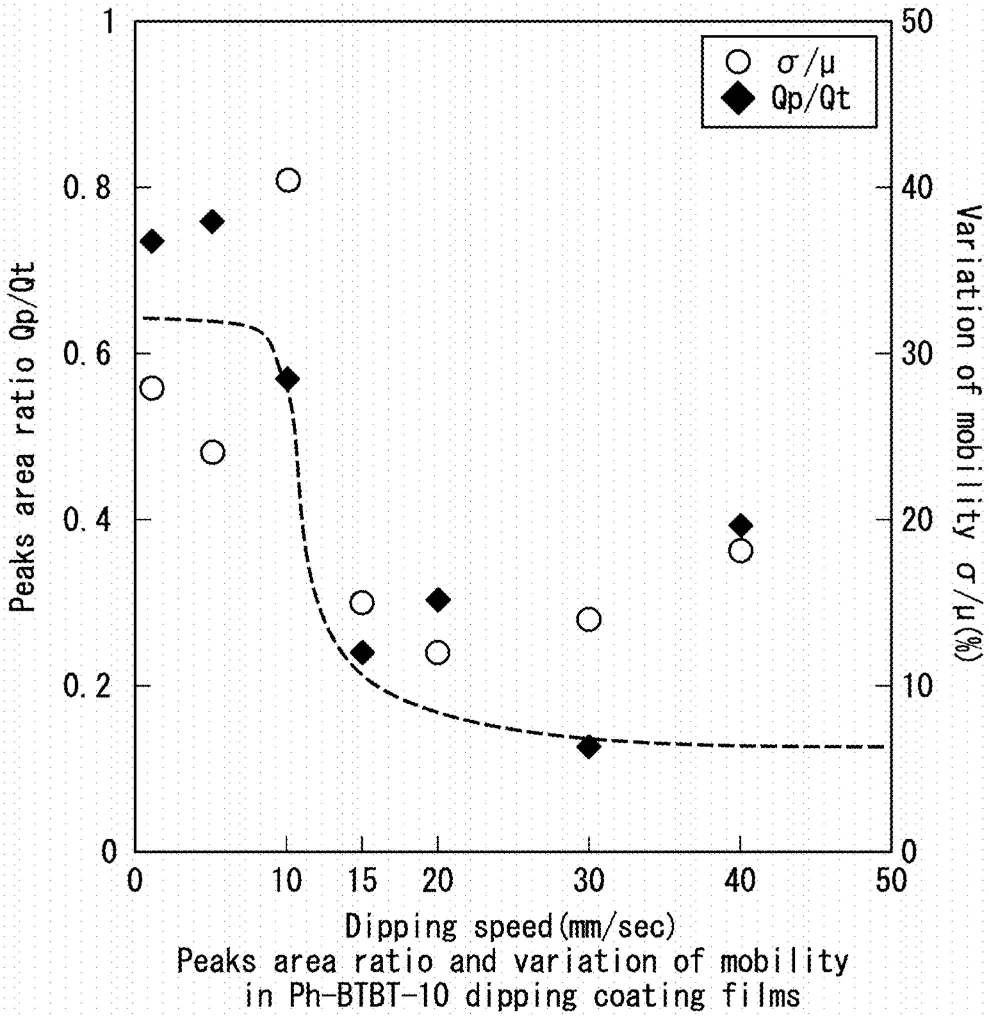
FIG. 9 is a graph having a horizontal axis indicating a lifting rate and a vertical axis indicating Qp/Qt and representing a variation of mobilities.

FIG. 9 represents a graph in which the horizontal axis indicates a lifting rate and the vertical axis indicates Qp/Qt. In FIG. 9, a variation of mobilities is written as "σ/μ."

The invention claimed is:

1. An organic semiconductor thin film including a liquid crystalline organic semiconductor, wherein an average film thickness is 100 nm or less, Qp and Qt to be measured using the measurement method which will be described below satisfy the following (1), and the following rocking scan pattern has a ratio Ipeak/Ibas, that is a ratio of Ipeak which is a peak intensity of the following maximum peak with respect to Ibas which is the following base line value, of less than 10:

$$0.06 \le Qp/Qt \le 0.5, \tag{1}$$

[Measurement method]

(i) A diffraction angle 2θ at which a peak of a (020) crystal plane is observed is specified by performing X-ray diffraction measurement on an organic semiconductor thin film in an in-plane direction of a surface of a substrate, (ii) A rocking scan pattern is obtained by fixing positions of the diffraction angle 2θ and a detector and performing X-ray diffraction measurement on the substrate on which the organic semiconductor thin film is formed in the in-plane direction of the surface of the substrate while rotating only the substrate by 180°, (iii) A base line of the rocking scan pattern is obtained, (iv) A maximum peak which exceeds the base line in a positive direction is specified in the rocking scan pattern and an area of a peak portion which exceeds the base line is defined as Qp, (v) A total peak area of the rocking scan pattern is defined as Qt.

2. A transistor, comprising:

the organic semiconductor thin film according to claim 1 as a semiconductor layer.

* * * * *